(12) United States Patent
Yonezawa

(10) Patent No.: US 6,617,579 B2
(45) Date of Patent: Sep. 9, 2003

(54) SCANNING ELECTRONIC BEAM APPARATUS

(75) Inventor: Akira Yonezawa, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/021,332

(22) Filed: Oct. 29, 2001

(65) Prior Publication Data

US 2002/0088941 A1 Jul. 11, 2002

(30) Foreign Application Priority Data

| Nov. 8, 2000 | (JP) | ........................................ 2000-340583 |
| Jun. 11, 2001 | (JP) | ........................................ 2001-175690 |
| Oct. 11, 2001 | (JP) | ........................................ 2001-313665 |

(51) Int. Cl.[7] ........................................... H01J 37/244
(52) U.S. Cl. ..................................................... 250/310
(58) Field of Search ............................. 250/310, 396 R, 250/396 ML

(56) References Cited

U.S. PATENT DOCUMENTS 4,658,137 A * 4/1987 Garth et al. ................ 250/310
5,945,672 A * 8/1999 Knowles et al. ............ 250/310
6,084,238 A * 7/2000 Todokoro et al. ........... 250/310

* cited by examiner

Primary Examiner—John R. Lee
Assistant Examiner—Phillip A Johnston
(74) Attorney, Agent, or Firm—Adams & Wilks

(57) ABSTRACT

Secondary electrons emitted by a sample placed within a lens magnetic field are detected by a plurality of secondary electron detectors to enable observation of a concave/convex sample surface. In a scanning electronic beam apparatus having upper and lower electrodes built in a single-pole magnetic-field type lens to place a sample within a lens magnetic field, a negative voltage is applied to the sample and the lower electrode opposed thereto while a zero or positive voltage is applied to the upper electrode, whereby an electric field for suppressing the helical motion of a secondary electron given off from the sample due to electron-beam irradiation is produced within an objective magnetic field space above the sample. The secondary electrons are detected by a division-type MCP or a plurality of scintillator-type secondary electron detectors sandwiching the optical axis.

32 Claims, 13 Drawing Sheets

SCANNING ELECTRONIC BEAM APPARATUS

BACKGROUND OF THE INVENTION

1. Field of the Invention

The present invention relates to a scanning electronic beam apparatus for detecting the secondary electrons given off from a sample in response to scanning the sample with an electron beam using a plurality of secondary electron detectors to process the signals from the detectors thereby making possible sample observation.

2. Description of the Related Art

Various electronic beam apparatuses, such as scanning electronic microscopes, have been conventionally used in order to perform topological inspections or observations of microfabricated electronic devices. In particular, there is an increasing need for observation with resolution effective for obtaining stereoscopic detection of samples, due to the advancement of super micro-fabrication in recent electronic devices. There is a known method using the secondary electrons from a sample as well as a plurality of detectors, as a method for SEM-observing a concave/convex shape on a sample surface (see JP-B-40-17999).

This conventional method is as follows. As shown in FIG. 10, first the electron beam 101 converged in diameter by a lens is deflected by a deflector unit 103, to conduct scanning over a surface of a sample 102. The reflection electrons caused from the sample 102 and back-scattered electrons 105 comprising secondary electrons are detected by the detectors 104a, 104b arranged nearly symmetrically about a sample normal line. If an electron beam is scanned in an arrowed direction onto a sample comprising different elements A, B shown in FIG. 11A, the signal to be detected by the detector 104a varies as in FIG. 11B while the signal to be detected by the detector 104b varies as in FIG. 11C. The detection signal resulting from a slant surface given from the detector 104b opposed to the slant surface is greater than the detection signal by the detector 104a. The detection signal outputs, if subtracted by a subtraction circuit 106, provides a signal dependent only on a concave/convex as shown in FIG. 11D. If this is further integrated by an integration circuit 107, an output can be obtained that nearly equals to the concave/convex on the sample surface as shown in FIG. 11E. Thus, the concave/convex topology on the sample surface can be observed on a display unit 108, wherein an image with greater stereoscopic feeling is obtained.

However, resolving power can be improved greater in an objective lens when a sample is placed in an intense lens magnetic field than in the usual objective lens when a sample is not put in a magnetic field. However, the secondary electrons given off from the sample will not travel toward the detector as in FIG. 10, i.e. helically moved around the optical axis a multiplicity of time and swirled up toward an electron source by the intense objective-lens magnetic field to a region free of the lens magnetic field where they are scattered in various directions. Accordingly, on a plane of the detector provided close to the electron source, there is a difficulty in distinguishing a directionality of the secondary electron upon being given off from the sample.

Namely, the conventional single-pole magnetic field type objective lens of a scheme to place a sample in an intense lens magnetic field has a structure, e.g. disclosed in JP-A-3-1432 (U.S. Pat. No. 5,023,457), as shown in FIG. 12. According to this structure, the secondary-electron beam 203 caused from a sample 202 due to the primary electrons emitted from the electron source and incident in a direction of an optical axis 201 (Z (mm)) travels toward the electron source and is detected by a secondary-electron detector 204.

FIG. 13 shows a simulation example of a secondary electron beam path in the lens (sample position is Z=−8 mm and top-surface position of a single magnetic pole 205 is Z=0). The secondary electrons helically move along an optical axis (Z) in a range having a great lens magnetic field (−8 mm $\leq Z \leq \approx 0$ mm) and scatter in various directions in a range the magnetic field vanishes ($\approx 0$ mm <Z). From FIG. 13, it can be seen that the secondary electrons given off leftward on the sample and the secondary electrons given off rightward on the sample are mixed together thus lose the directionality thereof upon leaving the sample.

In this manner, in the conventional apparatus there is difficulty in specifying the directionality of the secondary electrons given off from the sample because they are mixed together. Thus, there is a problem that, even if the secondary electrons passed the objective lens are detected by a plurality of detectors provided close to the electron source symmetrically about the optical axis to operate the secondary-electron signals from the detectors, there is difficulty in effectively observing the concave/convex topology of a sample.

SUMMARY OF THE INVENTION

It is an object of the present invention to provide a scanning electronic beam apparatus capable of solving the foregoing problem in the related art.

In order to detect secondary electrons given off from a sample by a plurality of detectors and obtain a concave/convex image of the sample or a high-resolution image emphasized in stereoscopic detection, the present invention provides a scanning electronic beam apparatus using an objective lens in which a sample is placed within an intense lens magnetic field, and the lens has a pair of electrodes comprising upper and lower electrodes having electrode apertures for passing an electron beam to a lens magnetic pole tip of the objective lens to apply a negative voltage to the sample and the lower electrode opposed thereto, whereby a zero or positive voltage is applied to the upper electrode provided close to an electrode source to cause an electric field for accelerating the secondary electron from the sample to an objective-lens magnetic field space closer to the electron source thereby suppressing the helical motion thereof.

With this structure, the secondary electron caused from a sample due to electron-beam irradiation, after passing through the electrode aperture of the lower electrode and the electrode aperture of the upper electrode, can be incident with directionality on the plurality of secondary electron detectors arranged substantially symmetrically around the optical axis. As a result, by carrying out an operation process on the basis of the signals from the detectors, it is possible to favorably observe a concave/convex image of the sample and obtain a high-resolution image emphasized in stereoscopic feeling.

According to the present invention, there is proposed, in a scanning electronic beam apparatus adapted to place a sample within a magnetic field by an objective lens built, at a lens magnetic pole tip, with a pair of electrodes along an optical axis, the scanning electronic beam apparatus characterized in that: a negative voltage is applied to a sample and one electrode opposed thereto while a zero or positive voltage is applied to the other electrode, thereby causing an electric field to suppress helical motion of secondary electrons given off from the sample due to electronic-beam irradiation in a region of from the sample to an objective-lens magnetic field space close to an electron source.

Electrode apertures for passing the secondary electron may be respectively provided in said one and the other electrodes to detect the secondary electron passed through said electrode apertures by a plurality of secondary electron detectors arranged substantially symmetrically around the optical axis.

Electrode apertures for passing the secondary electron may be respectively provided in said one and the other electrodes to cause the secondary electron passed through said electrode apertures to be incident on a reflection plate and detect an electron caused from said reflection plate by a plurality of secondary electron detectors arranged around the optical axis.

The reflection plate may have a partition plate.

An observation image of the sample may be obtained by operation on the basis of signals from said plurality of secondary electron detectors.

Values of negative voltages applied to the sample and said other electrode may be substantially equal.

The other electrode is a magnetic member.

According to the invention, there is also proposed, in a scanning electronic beam apparatus having an objective lens provided with an electrode opposed to a sample to place the sample within a lens magnetic field of said objective lens, the scanning electronic beam apparatus characterized in that: a negative voltage is applied to the sample and said electrode is put at a potential higher than the negative voltage, thereby causing an electric field to suppress helical motion of secondary electrons given off from the sample due to electronic-beam irradiation from the sample to an objective-lens magnetic field space close to an electron source.

An electrode aperture for passing the secondary electron may be provided in the electrode to detect the secondary electron passed through the electrode aperture by a plurality of secondary electron detectors arranged substantially symmetrically around an optical axis.

An electrode aperture for passing the secondary electron may be provided in the electrode to cause the secondary electron passed through the electrode aperture to be incident on a reflection plate and detect an electron caused from the reflection plate by a plurality of secondary electron detectors arranged around an optical axis.

The reflection plate may have a partition plate.

An observation image of the sample may be obtained by operation on the basis of signals from the plurality of secondary electron detectors.

The other electrode may be a magnetic member.

According to the invention, there is also proposed, in a scanning electronic beam apparatus using an objective lens of a scheme to place a sample within a lens magnetic field, the scanning electronic beam apparatus characterized in that: a negative voltage is applied to the sample to cause, in a space to an opposed magnetic pole at a ground potential to the sample, an electric field to suppress helical motion of secondary electrons given off from the sample due to electronic-beam irradiation in a region of from the sample to an objective-lens magnetic field space close to an electron source.

The secondary electron caused from the sample due to the electron-beam irradiation, after passing through a single magnetic pole aperture, may be detected by a plurality of secondary electron detectors arranged around an optical axis.

The secondary electron caused from the sample due to the electron-beam irradiation, after passing through a single magnetic pole aperture, may be incident on a reflection plate to detect an electron caused from the reflection plate by a plurality of secondary electron detectors arranged around an optical axis.

The reflection plate may have a partition plate.

An observation image of the sample may be obtained by operation on the basis of signals from the plurality of secondary electron detectors.

BRIEF DESCRIPTION OF THE DRAWINGS

FIG. 11A is a view showing a sample comprising different elements A and B, wherein an electron beam is scanned in an arrowed direction;

FIG. 11B is a graph showing a signal detected by a detector 104a;

FIG. 11C is a graph showing a signal detected by a detector 104b;

FIG. 11D is a graph showing a signal dependent only on a concave/convex formed by a subtraction circuit 106;

FIG. 11E is a graph showing an output signal nearly equal to the concave/convex on the sample surface.

DETAILED DESCRIPTION OF THE PREFERRED EMBODIMENTS

Now, one example of embodiments of the present invention will be explained in detail with reference to the drawings.

Figure 1:
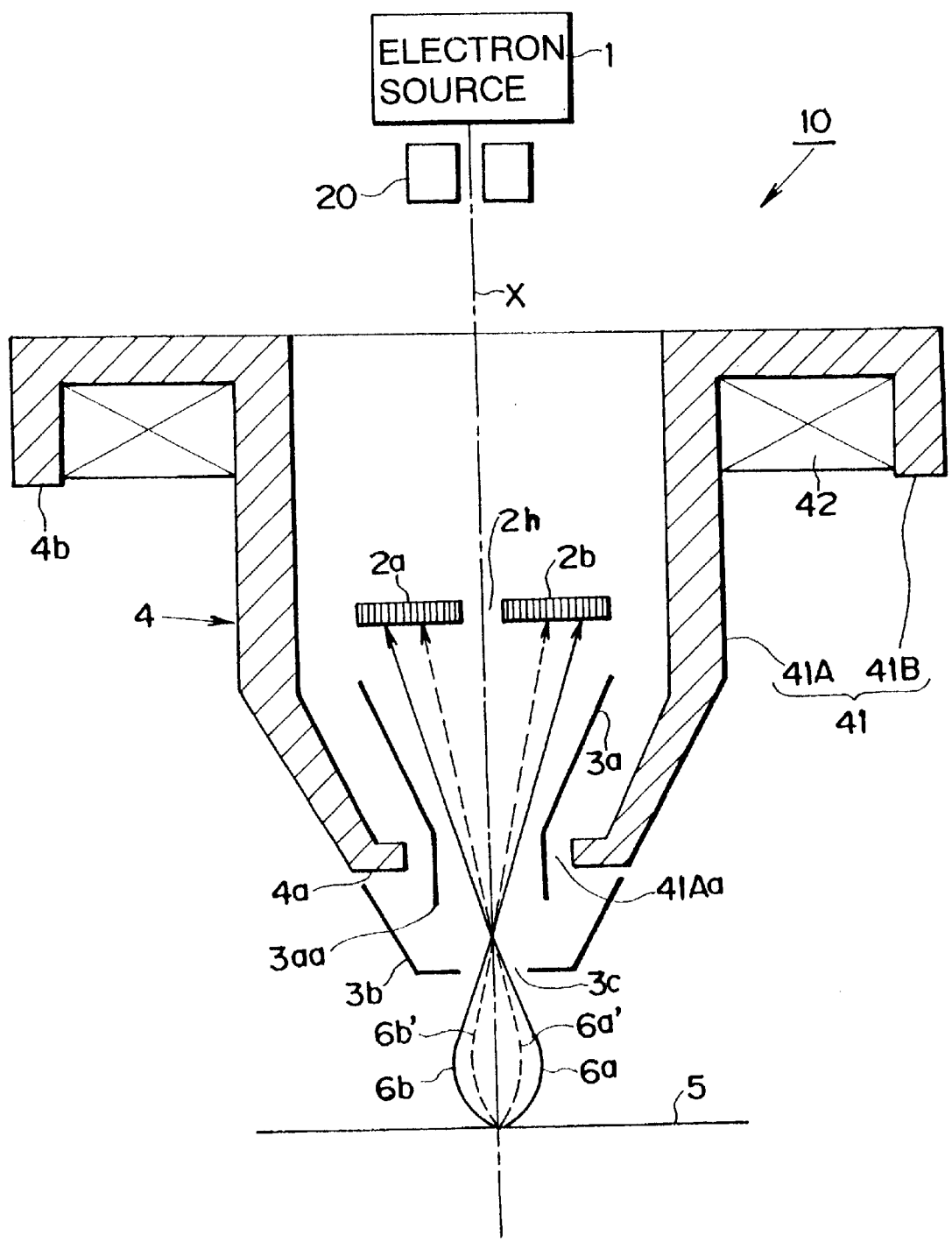
FIG. 1 is a structural view showing, by partly taking a section, one example of embodiments of a scanning electronic beam apparatus according to the present invention.

FIG. 1 is a structural view showing, by taking a partial section, one example of embodiments of a scanning electronic beam apparatus according to the present invention. The scanning electronic beam apparatus 10 is an apparatus for topologically inspecting or observing a microfabricated electronic device. The electron beam from an electron source 1 is accelerated for irradiation along a beam axis X toward a sample 5, wherein the electron beam is scanned for observation on the sample 5 by a deflector unit 20. Between the deflector unit 20 and the sample 5, a single-pole magnetic field type lens 4 is provided as an objective lens. This converges the electron beam from the electron source 1 into a small diameter on the sample 5.

The single-pole magnetic field type lens 4 has an excitation coil 42 above a magnetic pole 41. The magnetic pole 41 has a cylindrical body 41A having a somewhat tapered tip to have, at a lower end, a magnetic-pole aperture 41Aa for passing an electron beam. The body 41A, at an upper end edge, is integrally formed with an extension 41B in a sectional-L form extending radially outward. The excitation coil 42 is accommodated in an annular space encompassed by the body 41A and the extension 41B.

As a result, a magnetic field is formed between a single magnetic pole 4a at the tip of the single magnetic field type lens 4 opposed to the sample 5 and an extension end 4b of the extension 41B. The sample 5 is placed in an intense lens magnetic field directed from the single magnetic pole 4a toward the sample 5.

A pair of upper and lower electrodes are built in a lens magnetic-field tip of the single-pole magnetic field type lens 4 structured as above, i.e. in the vicinity of the single magnetic pole 4a. One is a lower electrode 3b arranged between the sample 5 and the single magnetic pole 4a. The lower electrode 3b is formed, at its center, with an electrode aperture 3c to pass an electron beam. The other is an upper electrode 3a arranged closer to an electron source 1 than the lower electrode 3b. Although the upper electrode 3a is arranged nearly accommodated in the body 41A, the upper electrode 3a has a lower end 3aa protruding through the magnetic pole aperture 41Aa toward the sample 5 to be positioned between the single magnetic pole 4a and the lower electrode 3b.

Nearly the same negative voltages are applied to the lower electrode 3b thus provided and the sample 5 while zero or positive voltage is applied to the upper electrode 3a. Due to this, an electric field is caused from the sample 5 to an objective-lens magnetic-field space of the electron source 1. This electric field serves to suppress the secondary electron caused by irradiation of an electron beam toward the sample 5 from helically moving due to a magnetic field caused between the sample 5 and the single magnetic pole 4a, upon traveling toward a pair of secondary-electron detectors 2a, 2b arranged symmetrically about an optical axis X within the single-pole magnetic-field type lens 4. Namely, although the sample 5 and the lower electrode 3b are nearly in the same potential, because of the presence of the electrode aperture 3c the electric field due to the zero or positive voltage given to the upper electrode 3a exerts an influence of the electric field to a space of between the lower electrode 3b and the sample 5, thereby accelerating the secondary electron toward the electron source 1. Thus, the second electron is suppressed from helically moving in the objective-lens magnetic-field space.

Figure 10:
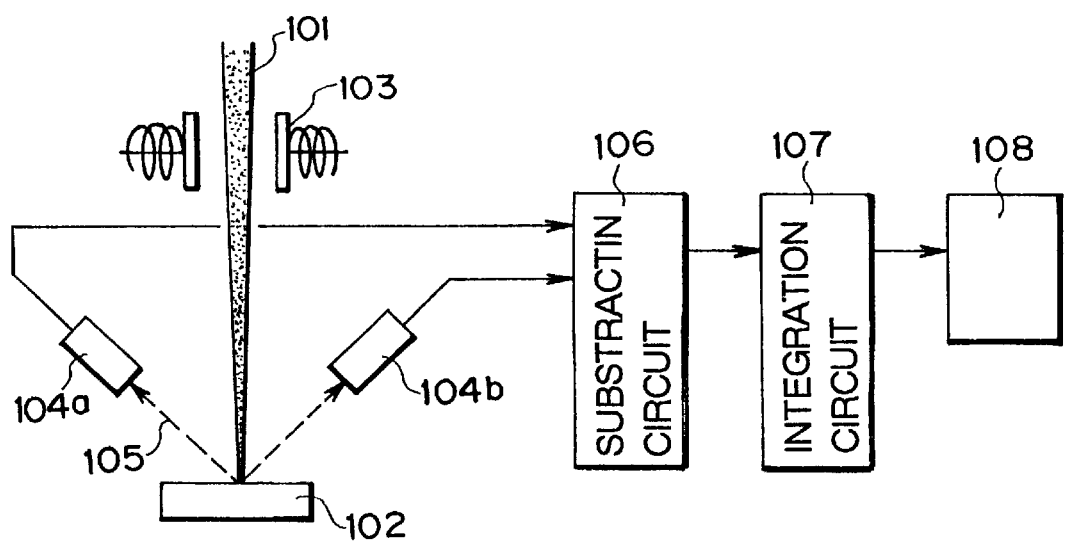
FIG. 10 is a schematic structural view for explaining a conventional scanning electronic beam apparatus.
Figures 11A, 11B, 11C, 11D, 11E:
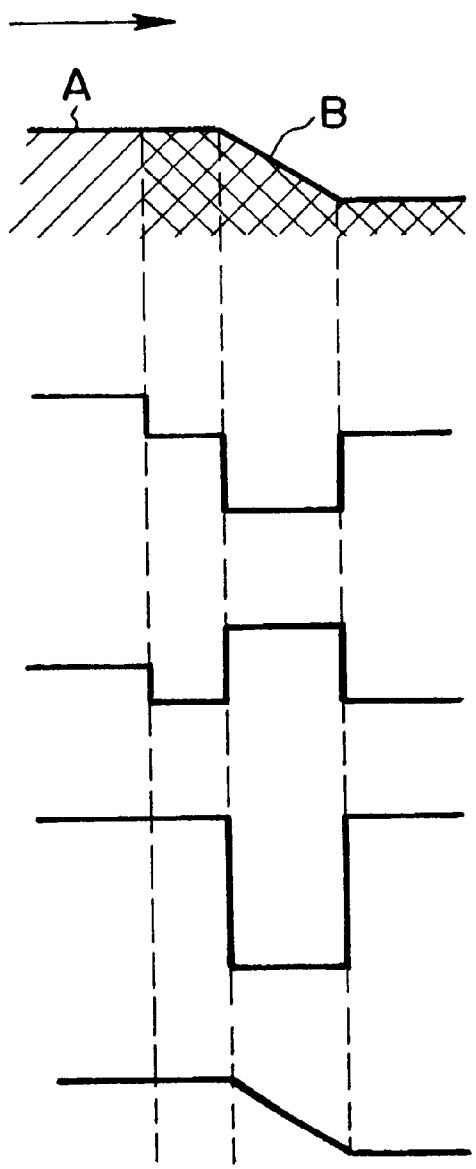

The secondary electron suppressed in helical motion as above is allowed to reach the secondary electron detector 2a or secondary electron detector 2b while keeping directionality. This makes it possible to stereoscopically observe a concave/convex on the sample 5 according to the principle explained on FIG. 10 and FIG. 11. Because the processing of a detection output from the secondary electron detector 2a, 2b is similar to that explained in FIG. 10 and FIG. 11, the circuit configuration for processing such a detection output will be omittedly shown in FIG. 1. The directionality of a secondary electron can be put under control by properly adjusting the potential difference between the upper electrode 3a and the lower electrode 3b and adjusting a secondary-electron path.

Next, explanation will be made on the operation effect by the structure of FIG. 1 on the basis of further concrete numerals.

Explanation is made on the case that the excitation coil 42 has a magnetomotive force of 1000 AT, the upper electrode 3a has a potential of 0V, the lower electrode 3b has a potential of −0.9 kV, the sample 5 has a potential of −1 kV, the electron source 1 has an electron gun voltage set at −2 kV, and a primary electron is to be incident at an incident energy of 1 kV on the sample 5.

If a primary electron is irradiated to the sample 5 in this manner, the secondary electrons 6a, 6b caused from the sample 5 are accelerated and guided to the above by the action of an electromagnetic field, as was already explained, caused between the single magnetic pole 4a and the sample 5. Herein, because of the presence of a potential difference of 100 V between the lower electrode 3b and the sample 5, an electric field is formed on the sample 5 and in a space closer to the electron source 1 than the sample 5. As a result, the secondary electron having an initial energy −10 eV given off from the sample 5 has a path as shown in FIG. 2.

Figure 12:
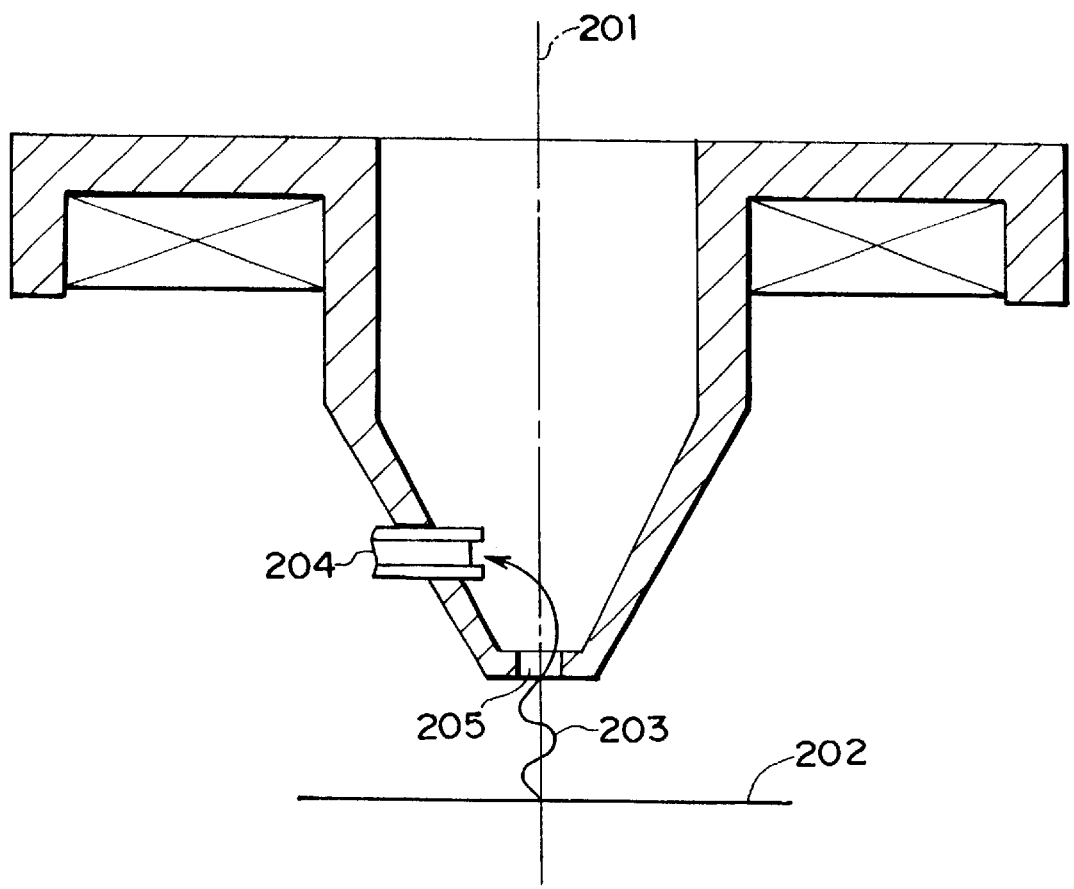
FIG. 12 is a sectional view showing one example of a single-pole magnetic-field type objective lens.
Figure 13:
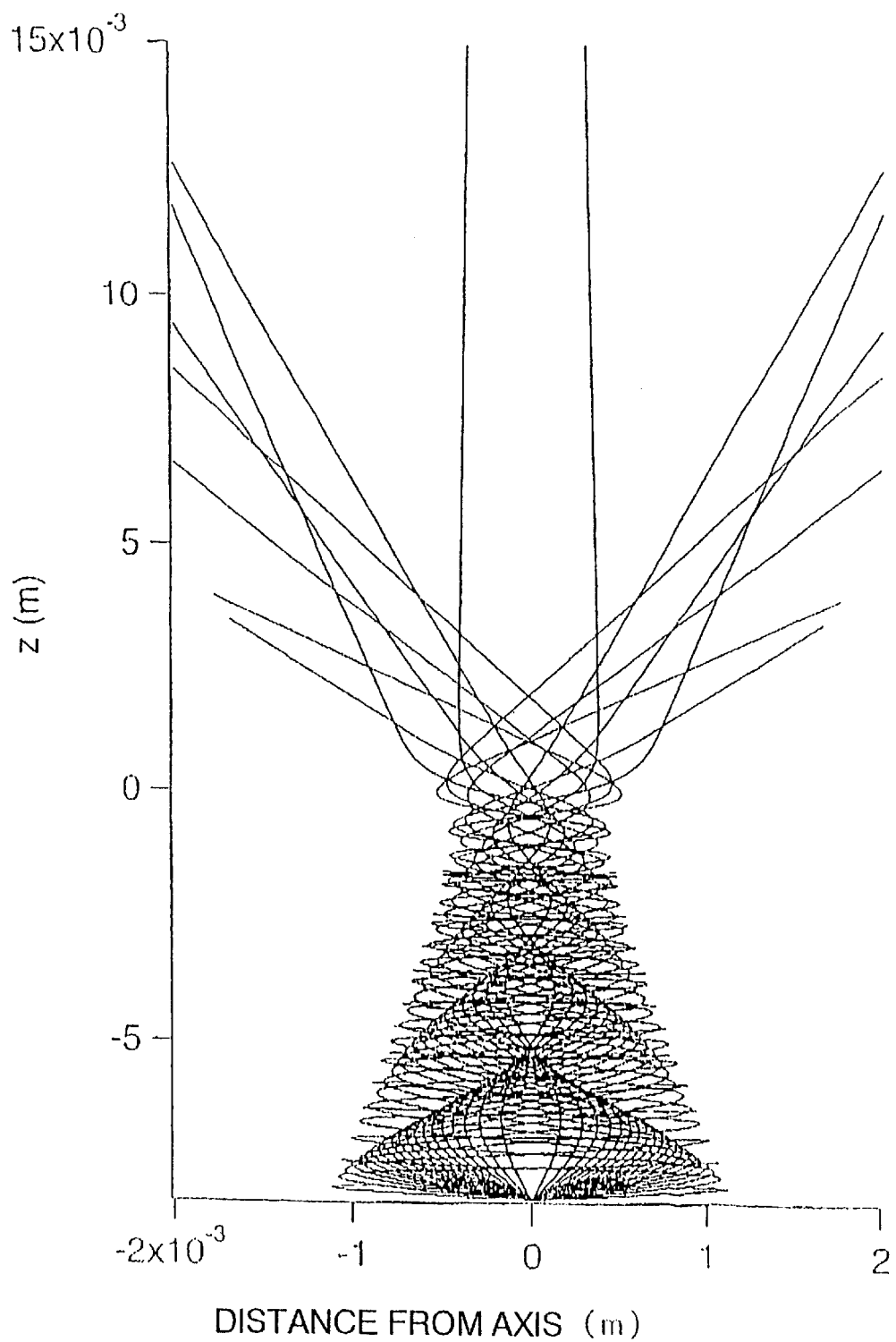
FIG. 13 is a graph showing one example of a simulation result on secondary electron beam path in a lens of the single-pole magnetic-field type objective lens.

The secondary electrons 6a, 6b are detected by the secondary electron detectors 2a, 2b provided nearly symmetrically around the optical axis X. The secondary electron detector 2a, 2b can be structured, for example, by a division-type micro-channel plate (MCP). The division-type MCP is usually provided in one body as a single unit to have a divided anode surface following a secondary-electron incident surface. However, because of the capability of separately detecting the signals of secondary electrons, a plurality of secondary-electron detectors 2a, 2b are provided. The secondary electrons 6a, 6a' given off rightward travel crossing the optical axis X and then take a path directed toward the secondary-electron detector 2a, thus being detected by the secondary-electron detector 2a. Also, the secondary electrons 6b, 6b' given off leftward similarly take a path directed toward the secondary-electron detector 2b, hence being detected by the secondary-electron detector 2b separately from the secondary electrons 6a, 6a'. It is therefore possible to observe, with emphasis, a concave/convex shape on the surface of the sample 5 based on a similar principle as that explained in FIG. 10. Namely, if a signal comprising the secondary electrons 6a, 6b is used without using a signal due to secondary electrons 6b, 6b', a shaded stereoscopic image can be obtained wherein the slant surface directed left on the sample is light but the surface directed right is dark. If using a difference from the secondary electrons 6b, 6b', a stereoscopic image can be obtained that further emphasizes the concave/convex surface. Also, if using a sum of a signal comprising the secondary electron 6a, 6a' and a signal comprising the secondary electron 6b, 6b', a non-stereoscopic image can be obtained that is emphasized in composition similarly to that obtained int eh conventional example shown in FIG. 12 or FIG. 13.

Figure 2:
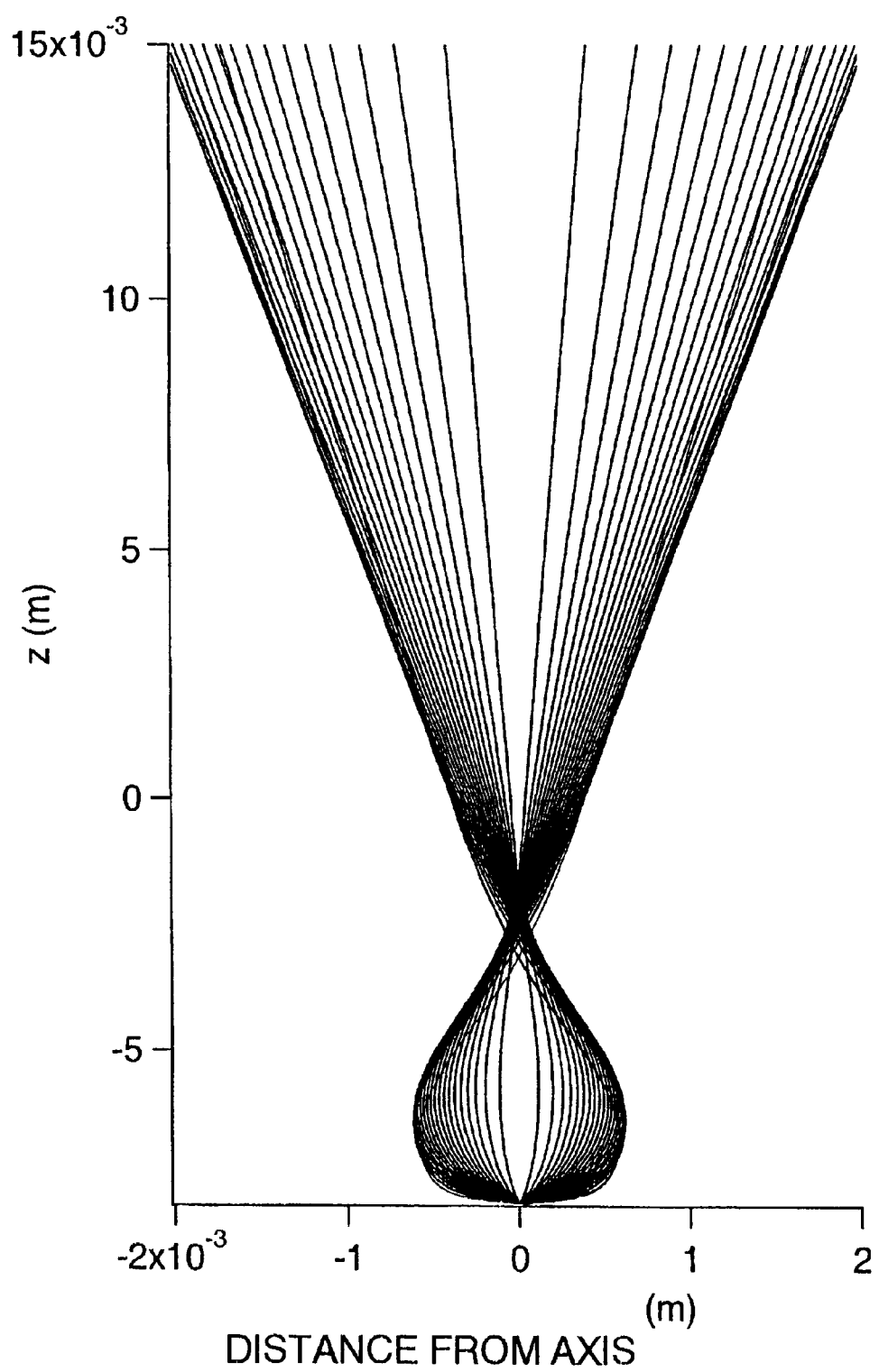
FIG. 2 is a graph showing one example of secondary-electron paths in the scanning electronic beam apparatus shown in FIG. 1.

In the above, one example was shown in FIG. 2 while showing concrete numerals wherein adjustment was made to allow the secondary electrons 6a, 6b to travel toward the secondary-electron detectors 2a, 2b while keeping a directionality. However, the path of the secondary electrons 6a, 6b shown in FIG. 2 is mere one example, i.e. other forms can be implemented.

Figure 3:
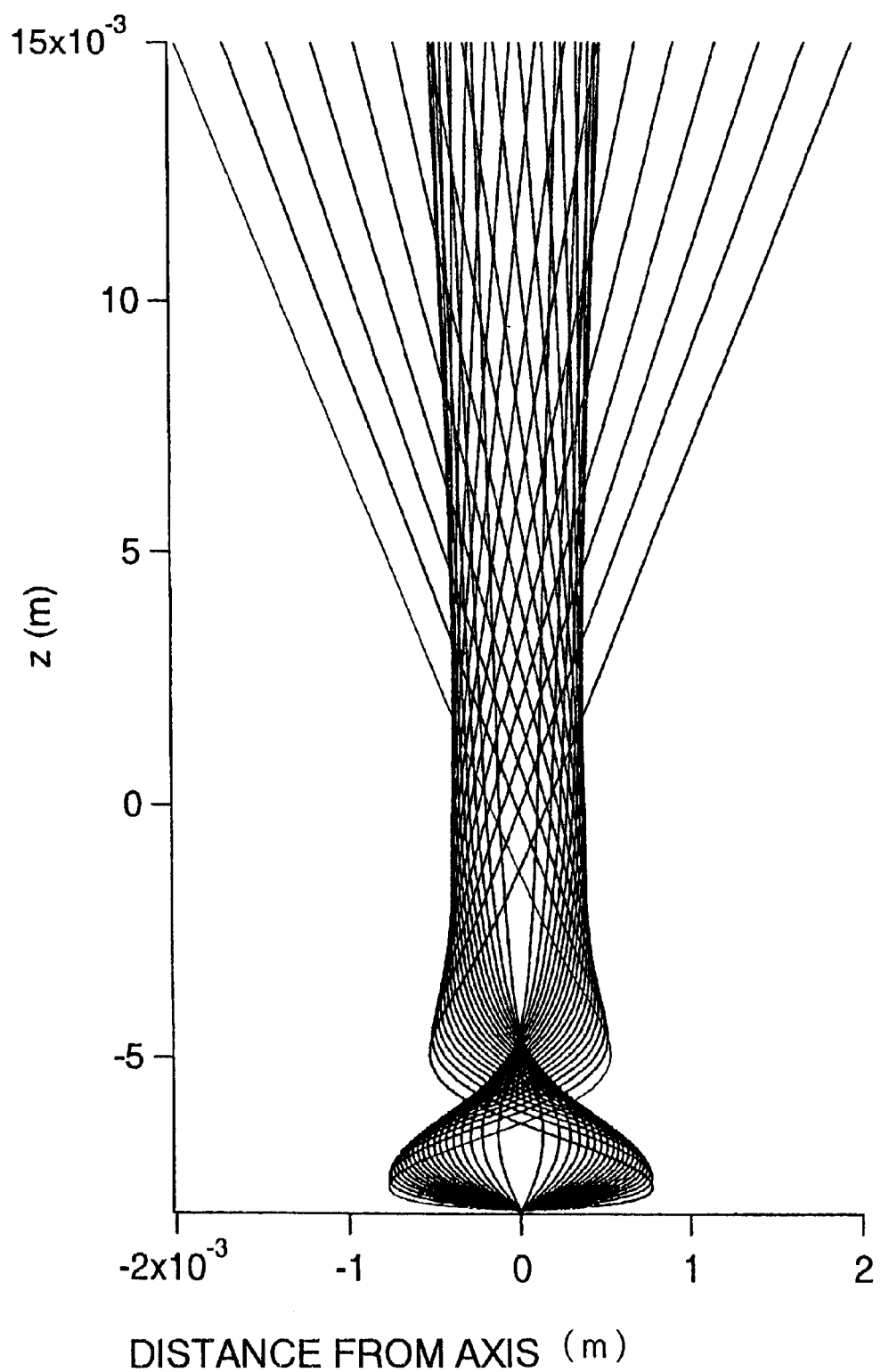
FIG. 3 is a graph showing another example of secondary-electron paths in the scanning electronic beam apparatus shown in FIG. 1.

FIG. 3 shows a form of a secondary-electron path in the case that the lower electrode 3b is put at a negative potential of −1 kV that is the same as that of the sample 5. In this example, the secondary electron given off leftward at a great angle with respect to the optical axis X crosses the optical axis X twice to move again in a leftward direction while the secondary electron given off rightward crosses the optical axis X twice to move again in a rightward direction, wherein it is understood that directionality is kept. Because the potential on the lower electrode 3b is the same as the potential on the sample 5, there is a possibility that the secondary electron given off from the sample 5 crosses the optical axis multiplicity of times to lose its directionality. However, it actually undergoes the action of an electric field existing in the above of around the sample 5 to keep directionality.

Figure 4:
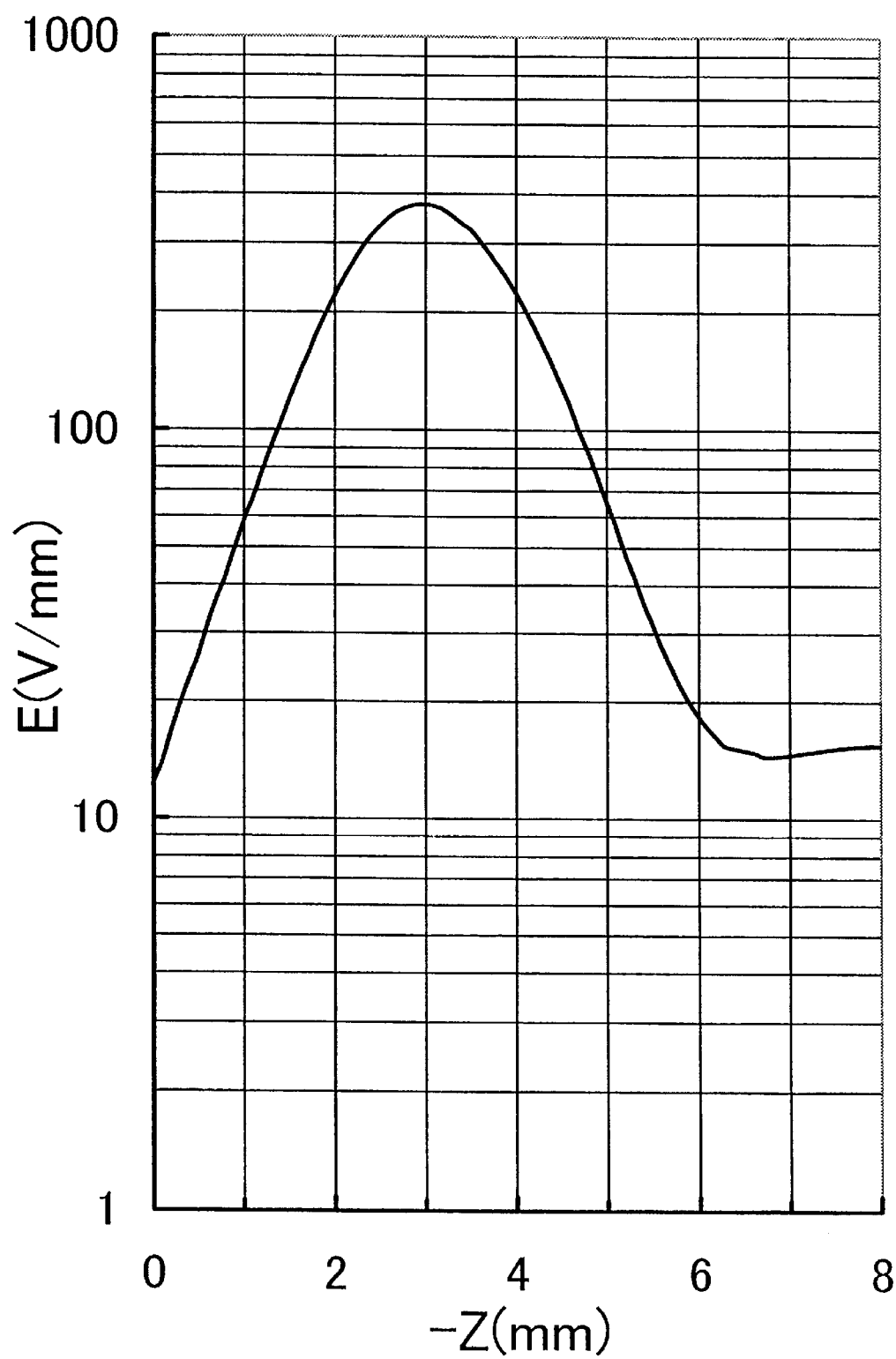
FIG. 4 is a graph showing a form of the magnitude of an electric field above a sample in FIG. 1.

FIG. 4 shows a form of a magnitude E (V/mm) of the electric field above the sample 5, wherein Z=0 mm represents a position of the single magnetic pole 4a and Z=−8 mm a position of the sample 5. An electric field is caused in a magnitude of from nearly 15 V/mm at above a surface of the sample 5 to nearly the maximum 400 V/mm at around the upper electrode 3a. The existence of the electric field above the sample 5 surface is due to the effect of the upper electrode 3a. As shown in FIG. 3, the secondary electron at around the optical axis X travels, with a spacing of about 0.5 mm to the optical axis, toward the secondary-electron detector to pass a primary-electron-detecting aperture 2c provided in the secondary electron detector 2a, 2b, hence being difficult in being detected. In this case, if the potential on the lower electrode 3b is somewhat changed, the secondary electron path changes thereby making it possible to disperse the secondary electrons at around the optical axis X.

Figure 5:
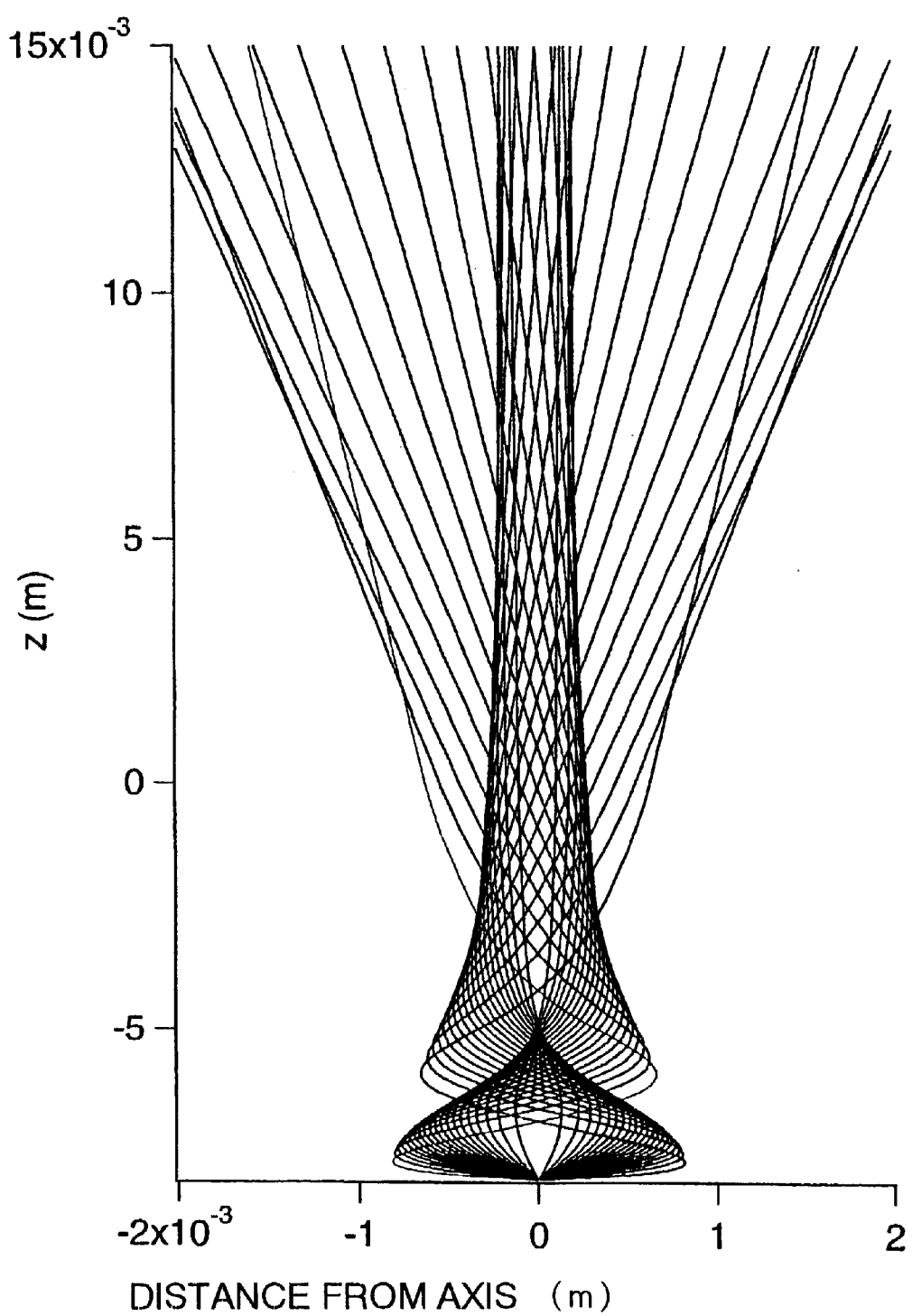
FIG. 5 is a graph showing still another example of secondary-electron paths in the scanning electronic beam apparatus shown in FIG. 1.

FIG. 5 shows a secondary electron path when the potential on the lower electrode 3b is given −1.01 kV. In this case, the electrons around the optical axis passing through the detector aperture 2h are reduced as compared to the example of FIG. 3, thus improving the efficiency of detection.

Note that, in the both cases, a positive voltage can be applied to the upper electrode 3a to adjust the secondary electron path. This can be similarly applicable to the case with an objective lens that the lower electrode is structured by a magnetic pole.

Figure 6:
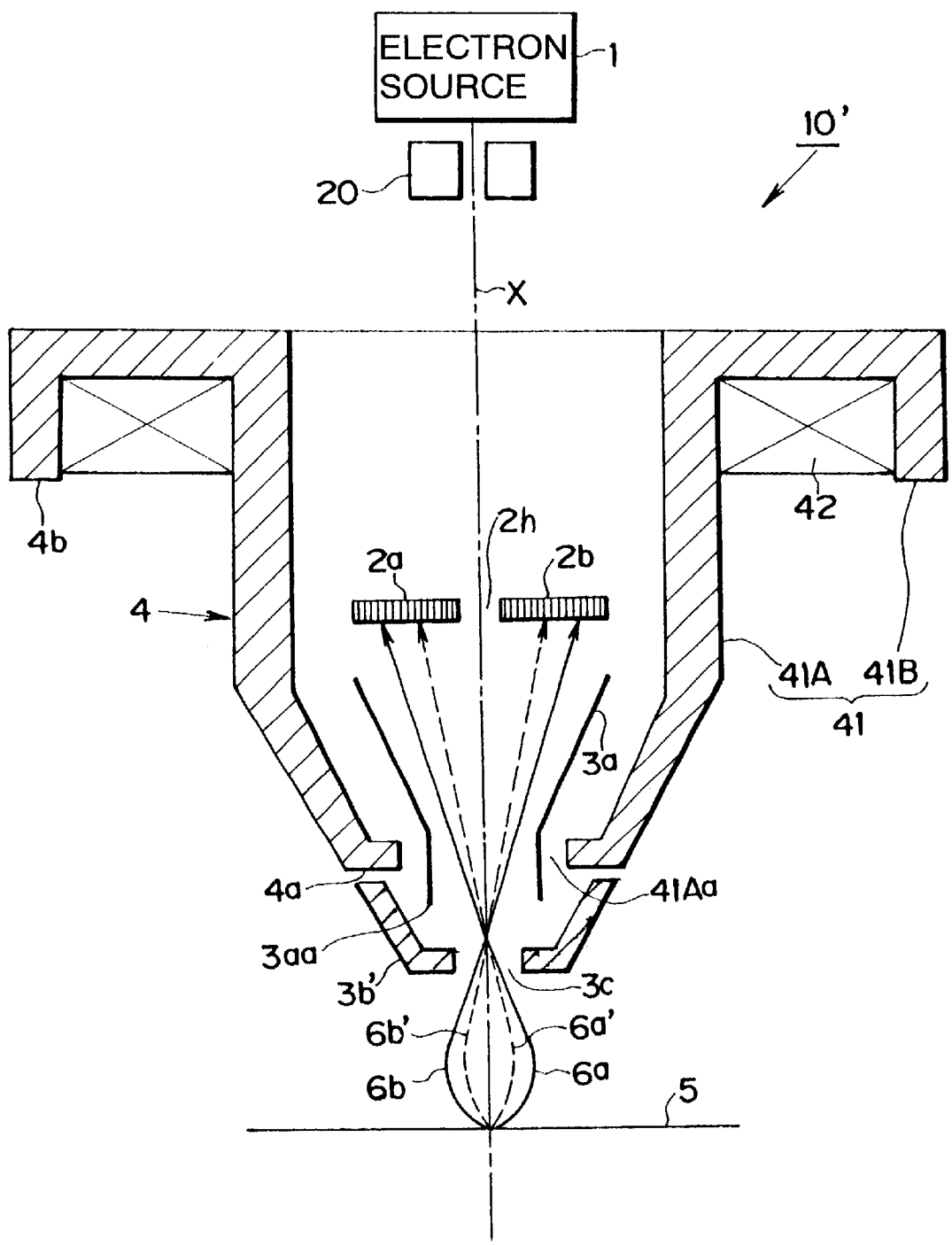
FIG. 6 is a structural view showing, by partly taking a section, another example of embodiments of a scanning electronic beam apparatus according to the present invention.

FIG. 6 shows an structural example in the case that the lower electrode 3b shown in FIG. 1 is made as a lower electrode 3b' formed of a magnetic member. The other parts of the scanning electronic beam apparatus 10' shown in FIG. 6 are identical to the corresponding parts of the scanning electronic beam apparatus 10 shown in FIG. 1, and these identical parts are attached with the same reference numerals to omit the explanations thereof. In also the case of the scanning electronic beam apparatus 10' structured as shown in FIG. 6, the corresponding potentials on the sample 5, the upper electrode 3a and the lower electrode 3b are given similarly to the case of FIG. 1 thereby causing an electric field to suppress the helical motion of the secondary electrons given off from the sample into the objective-lens magnetic-field space. This can provide a required directionality to the second electrons.

As in the foregoing examples, it has been confirmed that, if the lower electrode potential and the sample potential are made not largely different, favorable observation can be conducted on a non-conductive sample, such as resist, with less electrification. For a conductive sample, the potential if made different between the sample and the electrode opposed thereto can easily cause an electric field on the sample thus enabling observation with less electrification on the sample. Namely, where the lower electrode is applied by a potential higher than a sample potential, i.e. a small-valued negative potential, ground potential or positive potential, a downward electric field is caused on the sample and in the space above the sample even in the absence of an upper electrode. Thus, the secondary electrons are kept in directionality similarly to FIG. 2, making it possible to observing a concave/convex in the surface thereof. Furthermore, where the lower electrode is omitted, if a negative potential is applied to the sample to cause a downward electric field in cooperation with a ground potential on the single magnetic pole 4a, the secondary electrons are kept in directionality similarly to the foregoing thus making it possible to observe a concave/convex in the surface.

The embodiments shown in FIG. 1 and FIG. 6 both explained on the case that the secondary electron detector 2a, 2b for detecting a secondary electron 6a, 6b was structured as a division-type micro-channel plate (MCP). However, the scanning electronic beam apparatus according to the invention can be structured by using another type secondary electron detector.

Figure 7:
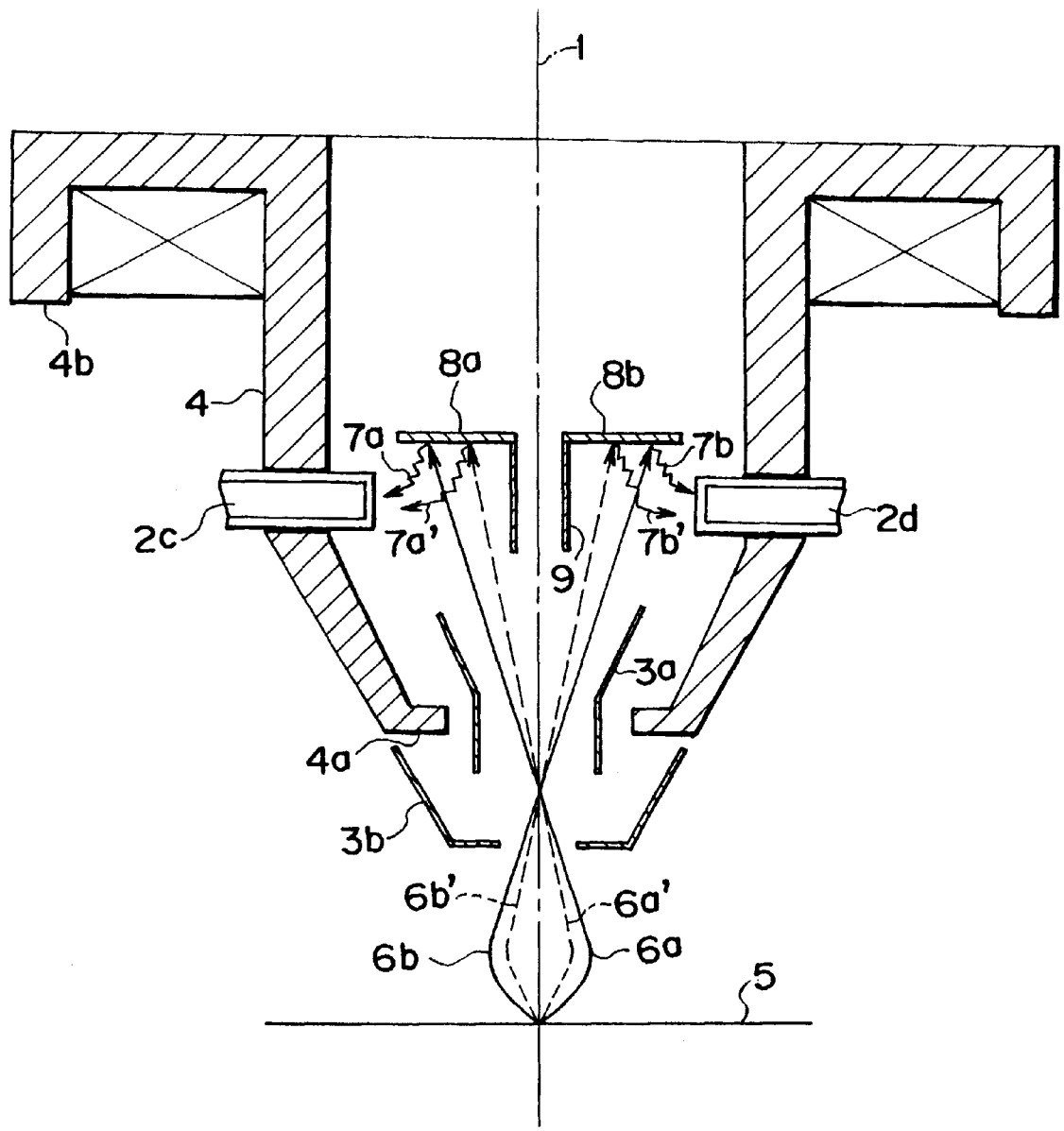
FIG. 7 is a structural view showing another example of embodiments of a scanning electronic beam apparatus according to the present invention.

FIG. 7 shows an embodiment of the invention in the case that the usual scintillator-type secondary electron detector is used as a secondary electron detector in place of the division-type MCP shown in FIG. 1. The parts of FIG. 7 corresponding to the parts of FIG. 1 are attached with the same reference numerals to omit explanations thereof. The scintillator-type secondary electron detectors 2c, 2d penetrate a single-pole magnetic-field type lens yoke and provided oppositely sandwiching the optical axis. The scintillator-type detector has a merit; it is generally cheaper but more unlikely to deteriorate than the MCP detector. The strength of the lens is equivalent to that of the embodiment shown in FIG. 1.

In FIG. 7, the secondary electrons 6a, 6a' having an energy of several eV given off rightward and the secondary electrons 6b, 6b, given off leftward, after passing through electrode apertures 3b, 3a and magnetic-pole aperture 4a, are accelerated to 1 kV and incident on a pair of reflection plates 8a, 8b generally in a fan shape as conductor poles each put at a ground potential.

Figure 8:
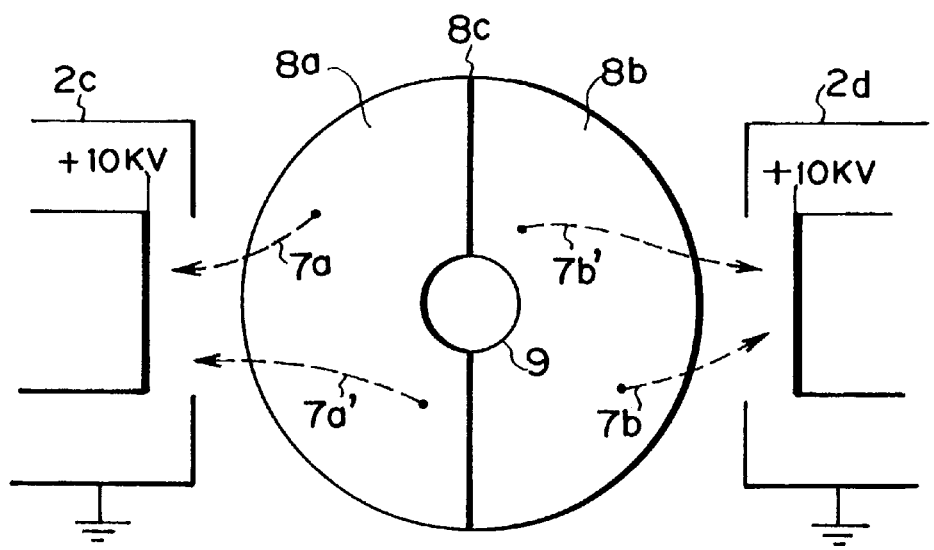
FIG. 8 is a view of a reflection plate, partition plate and secondary electron detector in the scanning electronic beam apparatus shown in FIG. 7, as viewed in an optical-axis direction.

As can be understood from FIG. 7 and FIG. 8, the reflection plates 8a, 8b are mutually connected in a manner of forming an annular plate member. A partition plate 8c is provided in a joint of these reflection plates 8a, 8b to project toward the sample 5. Furthermore, an electricity-preventing cylinder 9 is attached on the reflection plates 8a, 8b in order to prevent the occurrence of astigmatism due to a +10 kV high voltage electric field applied to the scintillators of the secondary electron detectors 2c, 2d. The electricity-preventing cylinder 9 is provided coaxial to the annular plate member formed by the reflection plates 8a, 8b. This provides a structure that the electron beam from the electron source 1 is allowed to reach the sample 5 without interference by the reflection plates 8a, 8b and electricity-preventing cylinder 9.

FIG. 8 is a view of the reflection plates 8a, 8b, partition plate 8c and electricity-preventing cylinder 9 as viewed in a direction from the sample 5. The further secondary electrons 7a, 7a' caused by the reflection plate 8a are accelerated under the action of a high voltage electric field due to the partition plate 8c by the secondary electron detector 2c, thus being detected by the secondary electron detector 2c. The further secondary electrons 7b, 7b' caused by the reflection plate 8b are detected in the similar way by the secondary electron detector 2d. It is therefore possible to observe a concave/convex in a surface of the sample 5 on the similar principle to that explained with reference to FIG. 10.

Figure 9:
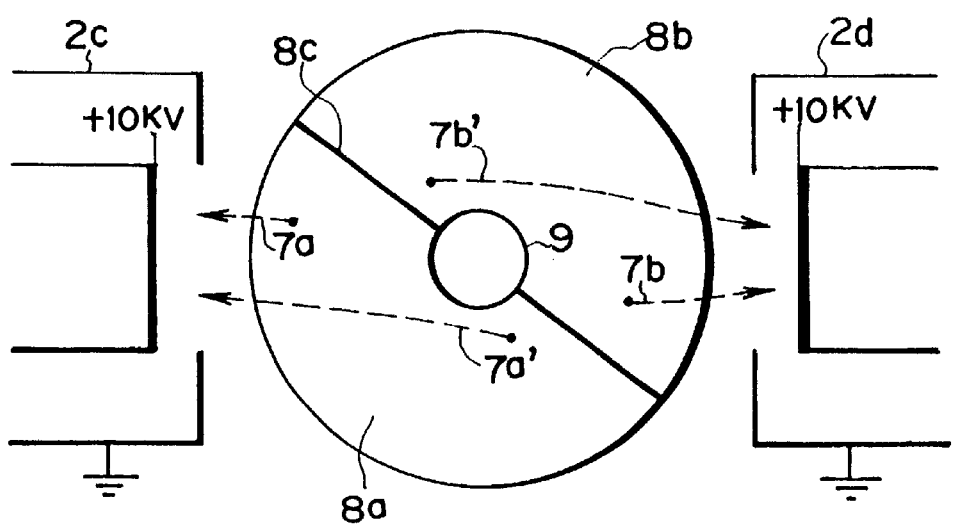
FIG. 9 is a view showing a partition plate provided slanted with respect to a secondary-electron-detector opposing plane in the scanning electronic beam apparatus shown in FIG. 7.

Note that, because actually the secondary electrons 6a, 6a' given off rightward and the secondary electrons 6b, 6b' given off leftward rotate about the optical axis under the action of a lens magnetic field, the position that these secondary electrons reach the reflection plate is not necessarily the position shown at 8a, 8b in FIG. 8. Consequently, if the secondary electron detectors and the partition plate are properly set in their positions depending upon a rotation angle of the secondary electrons, it is then possible to separately detect the secondary electrons 6a, 6a, given off rightward and the secondary electrons 6b, 6b' given off leftward. Namely, by rotating the partition plate 8c about the optical axis depending upon the position of reached secondary electrons and setting up it obliquely to an opposed plane to the secondary electron detector, for example, as shown in FIG. 9, separate detection can be conducted for the secondary electrons given off rightward and leftward. This causes shading in the right-and-left direction on the image. Furthermore, the direction of shading can be desirably adjusted on the image.

Although FIG. 8 and FIG. 9 explained on the example the partition plate 8c was provided on the reflection plates 8a, 8b, a shaded image is obtained even where a partition plate is not provided on the reflection plates. The reason of this will be explained below. The scintillator-type secondary electron detectors 2c and 2d are applied with a +10 kV high voltage for attracting secondary electrons. In the case that the partition plate 8c is removed from FIG. 8, the electric field at almost a center between the two detectors is nearly zero. The electric field due to the secondary electron detector 2c is intense in a region 8a whereas the electric field due to the secondary electron detector 2d is intense in a region 8b. Consequently, the secondary electron at several eVs given off from the reflection plate is attracted by the secondary electron detector having a stronger electric field and detected through nearly the same path as that at 7a, 7b or the like. Namely, the secondary electrons given off from the reflection plates are detected by the secondary electron detectors 2a, 2b in the left and right, similarly to the case with a partition plate. Thus, a shaded image can be obtained. However, the direction of shading on an image is unambiguously determined by the rotation due to a lens magnetic field as in the foregoing. Namely, shading occurs, for example, in an oblique direction instead of a left-and-right direction.

Figure 14:
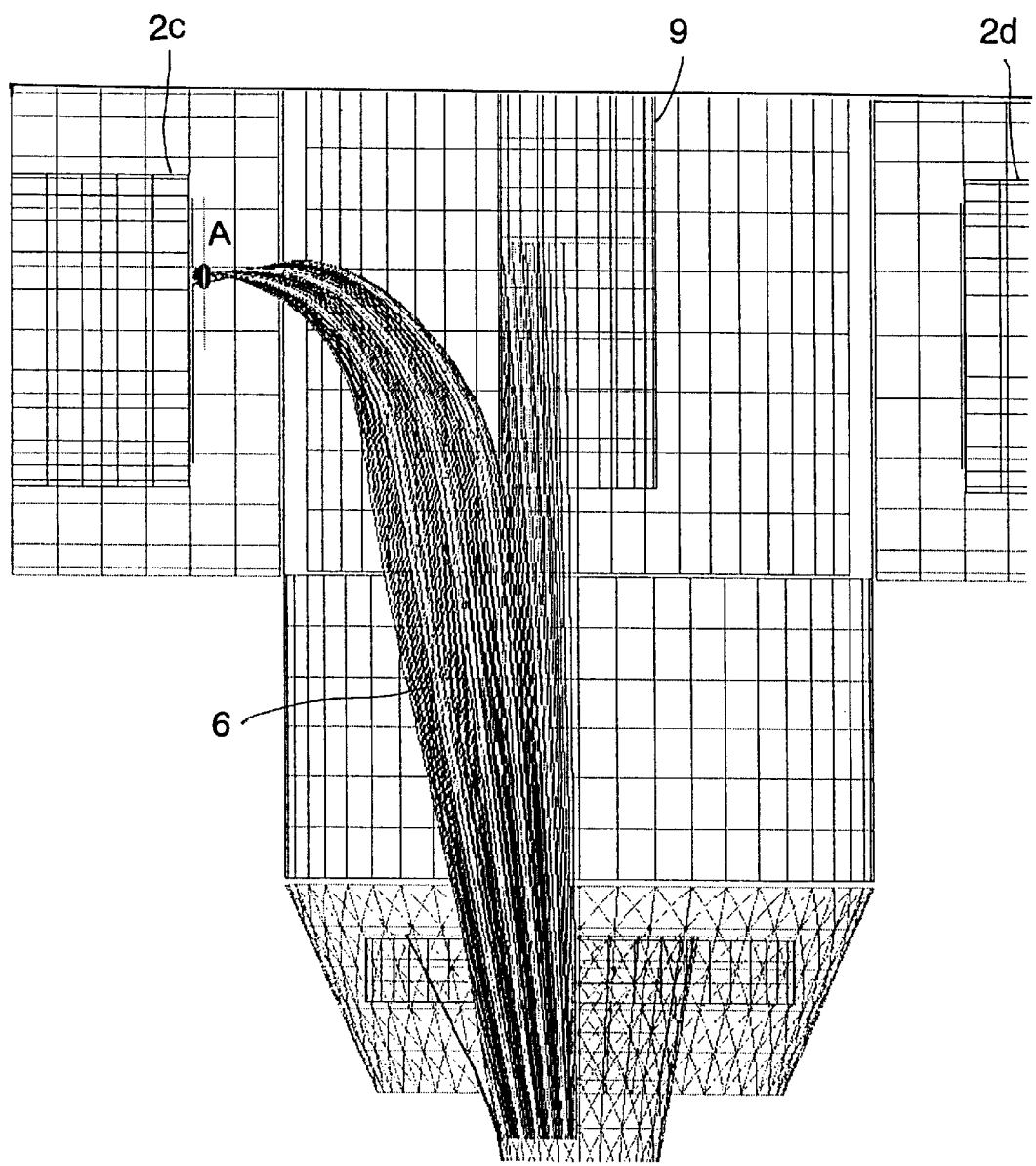
FIG. 14 is a graph showing one example of a secondary electron path in the scanning electronic beam apparatus shown in FIG. 7.

Although explanation was made with FIGS. 7, 8 and 9 on the example to detect the secondary electrons caused from the reflection plates, the secondary electrons from the sample 5 can be detected by the scintillator-type secondary electron detectors 2c, 2d directly instead of through the reflection plates. FIG. 14 shows a simulation path of the secondary electrons 6 given off from the sample. The symbols 2c, 2d represent scintillator-type secondary electron detectors, and 9 shows an electricity-preventing cylinder. The potential on the upper and lower electrodes is 0 V and the sample potential is −200 V. The secondary electrons at several eVs given off from the sample is accelerated to nearly 200 V and attracted to a high voltage +10 kV of the secondary electron detector without reaching the reflection plate, thus being incident and detected on a scintillator plane A. In FIG. 14, the secondary electrons at the right half with respect to the optical axis are not shown, although they are detected by the detector 2d similarly to the secondary electrons at the left half.

Meanwhile, even if the sample potential is nearly −1 kV, the secondary electrons from the sample can be detected through a secondary-electron path as shown in FIG. 1 by arranging scintillator-type secondary electron detectors from the obliquely above such that the scintillator plane is directed toward the sample.

Although the embodiment shown in FIG. 7 showed the structure to detect secondary electrons by using two secondary electron detectors 2c, 2d, four secondary electron detectors may be used to divide the reflection plate into four regions by a partition plate thereby providing a structure for detecting secondary electrons. According to this structure, it is possible to observe a concave/convex on the surface at its front and rear in addition to at its left and right. Further, the two secondary electron detectors shown in FIG. 7 may not be necessarily provided oppositely sandwiching the optical axis. In such a case, the proper arrangement of the foregoing partition plate makes it possible to observe a concave/convex on the sample surface with emphasis.

According to the present invention, in an objective lens that a sample is to be placed in a lens intense magnetic field, an electric field is caused on the sample and in a space closer to an electron source than the sample to thereby suppress the helical motion of a secondary electron thereby keeping the directionality of the secondary electrons caused from the sample, whereby the secondary electrons are detected in demarcation by a plurality of secondary electron detectors arranged closer to the electron source and around an optical axis. Consequently, it is possible to observe a surface concave/convex topology effectively and with resolution. Meanwhile, if secondary-electron detection is structured such that the secondary electron passed through the electrode aperture is incident on a reflection plate to detect an electron caused from the reflection plate by a plurality of secondary electron detector opposed sandwiching the optical axis, a scintillator-type secondary electron detector can be utilized inexpensively and over a long term. Thus, it is possible to obtain a scanning electronic beam apparatus that is low in price and cheap in maintenance cost.

What is claimed is:

1. A scanning electron beam apparatus comprising: an objective lens for producing a magnetic field; means for placing a sample within the magnetic field; a magnetic pole opposing the sample; means for applying a negative voltage to the sample and a potential higher than the negative voltage to the magnetic pole to produce, in a space between the sample and the opposed magnetic pole, an electric field effective to suppress helical motion of secondary electrons given off from the sample due to electron-beam irradiation in an objective lens magnetic field space above the sample; and a plurality of secondary electron detectors arranged symmetrically around an optical axis of the objective lens to detect the secondary electrons.

2. A scanning electron beam apparatus according to claim 1; wherein the magnetic pole has an aperture; and the secondary electrons emitted from the sample due to the electron-beam irradiation pass through the aperture before being detected by the plurality of secondary electron detectors.

3. A scanning electron beam apparatus according to claim 2; further comprising a reflection plate; wherein the secondary electrons emitted from the sample due to the electron-beam irradiation pass through the aperture before being incident on the reflection plate, and electrons reflected by the reflection plate are detected by the plurality of secondary electron detectors.

4. A scanning electron beam apparatus according to claim 3; wherein the reflection plate has a partition plate projecting toward the sample.

5. A scanning electron beam apparatus according to claim 1; wherein an image of the sample is obtained on the basis of a plurality of signals from the plurality of secondary electron detectors.

6. A scanning electron beam apparatus according to claim 1; wherein the objective lens has an electrode opposed to the sample, the electrode being held at a potential higher than the negative voltage applied to the sample to produce the electric field effective to suppress helical motion of the secondary electrons.

7. A scanning electron beam apparatus according to claim 6; wherein the objective lens has another electrode, and the respective electrodes are disposed along the optical axis of the objective lens at a tip of the magnetic pole.

8. A scanning electron beam apparatus according to claim 7; wherein the negative voltage is applied to one of the electrodes, and the potential higher than the negative voltage is applied to the other electrode to produce the electric field effective to suppress helical motion of the secondary electrons.

9. A scanning electron beam apparatus according to claim 7; wherein at least one of the electrodes is provided with an aperture for passing the secondary electrons.

10. A scanning electron beam apparatus according to claim 9; further comprising a reflection plate on which the secondary electrons that have passed through the aperture are incident.

11. A scanning electron beam apparatus according to claim 10; wherein the reflection plate has a partition plate projecting toward the sample.

12. An objective lens for a scanning electron beam apparatus, comprising: a magnetic pole for producing a magnetic field in which a sample is located during use of the apparatus; and a voltage source for applying a negative voltage to the sample to produce an electric field effective to suppress helical motion of secondary electrons emitted by the sample in response to irradiation of the sample by an electron beam.

13. An objective lens for a scanning electron beam apparatus according to claim 12; wherein the voltage source applies a ground potential or a positive voltage to the magnetic pole.

14. An objective lens for a scanning electron beam apparatus according to claim 12; further comprising an electrode; wherein the voltage source applies a voltage to the electrode with a larger value than the negative voltage applied to the sample.

15. An objective lens for a scanning electron beam apparatus according to claim 12; further comprising an aperture provided in the magnetic pole for passing the secondary electrons; and a plurality of secondary electron detectors symmetrically arranged around an optical axis to detect the secondary electrons.

16. An objective lens for a scanning electron beam apparatus according to claim 15; further comprising a circuit for producing a stereoscopic image of the sample based on output signals output by the plurality of secondary electron detectors.

17. An objective lens for a scanning electron beam apparatus according to claim 12; further comprising an aperture provided in the magnetic pole for passing the secondary electrons; a reflection plate on which secondary electrons are incident after passing through the aperture; and a plurality of secondary electron detectors symmetrically arranged around an optical axis to detect the secondary electrons.

18. An objective lens for a scanning electron beam apparatus according to claim 17; wherein the reflection plate has a partition plate projecting toward the sample.

19. An objective lens for a scanning electron beam apparatus according to claim 12; further comprising a pair of electrodes provided near a tip of the magnetic pole along an optical axis; wherein the voltage source applies a negative voltage to a first one of the pair of electrodes and a ground potential or a positive voltage to a second one of the pair of electrodes.

20. An objective lens for a scanning electron beam apparatus according to claim 19; wherein the voltage source applies a ground potential to the magnetic pole.

21. An objective lens for a scanning electron beam apparatus according to claim 19; further comprising apertures provided in the pair of electrodes for passing the secondary electrons.

22. An objective lens for a scanning electron beam apparatus according to claim 19; wherein values of negative voltages applied to the sample and the first electrode are substantially equal.

23. An objective lens for a scanning electron beam apparatus according to claim 19; wherein the second electrode is a magnetic member.

24. In a method of operating a scanning electron beam apparatus having an objective lens with a magnetic pole for producing a magnetic field in which a sample is located during use, performing the step of: applying a negative voltage to the sample to produce an electric field between the magnetic pole and the sample effective to suppress helical motion of secondary electrons emitted by the sample in response to irradiation of the sample by an electron beam.

25. A method of operating a scanning electron beam apparatus according to claim 24; further comprising the step of applying a ground potential to the magnetic pole of the objective lens while the negative voltage is applied to the sample.

26. A method of operating a scanning electron beam apparatus according to claim 24; further comprising the steps of providing an aperture in the magnetic pole for passing the secondary electrons; and arranging a plurality of secondary electron detectors around an optical axis to detect the secondary electrons.

27. A method of operating a scanning electron beam apparatus according to claim 26; further comprising the steps of providing a reflection plate onto which secondary electrons are incident after passing t rough the aperture.

28. A method of operating a scanning electron beam apparatus according to claim 26; further comprising the step of producing an image of the sample based on output signals of the plurality of secondary electron detectors.

29. A method of operating a scanning electron beam apparatus according to claim 24; further comprising the steps of providing a pair of electrodes near the tip of the objective lens along an optical axis; applying a negative voltage to a first one of the pair of electrodes opposed to the sample; and applying a zero or positive voltage to a second one of the pair of electrodes to produce the electric field.

30. A method of operating a scanning electron beam apparatus according to claim 29; further comprising the step of providing apertures in the pair of electrodes for passing the secondary electrons.

31. A method of operating a scanning electron beam apparatus according to claim 30; wherein values of negative voltages applied to the sample and the first electrode are substantially equal.

32. A method of operating a scanning electron beam apparatus according to claim 31; wherein the second electrode is a magnetic member.

* * * * *